(12) United States Patent
Lu et al.

(10) Patent No.: US 8,890,293 B2
(45) Date of Patent: Nov. 18, 2014

(54) GUARD RING FOR THROUGH VIAS

(75) Inventors: Chih-Hung Lu, Zhudong Township (TW); Song-Bor Lee, Zhubei (TW); Ching-Chen Hao, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/328,715

(22) Filed: Dec. 16, 2011

(65) Prior Publication Data
US 2013/0154048 A1 Jun. 20, 2013

(51) Int. Cl.
*H01L 29/40* (2006.01)

(52) U.S. Cl.
USPC ........... 257/621; 257/773; 257/487; 257/488; 257/490; 257/494; 257/496; 257/508; 257/665; 257/E29.012; 257/E29.013

(58) Field of Classification Search
USPC ........................................................ 257/621
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,525,535 A * | 6/1996 | Hong ............................ | 438/228 |
| 5,767,001 A | 6/1998 | Bertagnolli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |

(Continued)

*Primary Examiner* — Matthew W Such
*Assistant Examiner* — Samuel Lair
(74) *Attorney, Agent, or Firm* — Slater and Matsil, L.L.P.

(57) ABSTRACT

A guard ring for a through via, and a method of manufacture thereof, is provided. The guard ring comprises one or more rings around a through via, wherein the rings may be, for example, circular, rectangular, octagon, elliptical, square, or the like. The guard ring may be formed from a contact through an inter-layer dielectric layer and interconnect structures (e.g., vias and lines) extending through the inter-metal dielectric layers. The guard ring may contact a well formed in the substrate.

20 Claims, 8 Drawing Sheets

(56) References Cited

U.S. PATENT DOCUMENTS

| | | | |
|---|---|---|---|
| 7,705,462 B2* | 4/2010 | Uchikoshi et al. | 257/758 |
| 7,709,908 B2* | 5/2010 | Su et al. | 257/409 |
| 2005/0040489 A1* | 2/2005 | Chuang et al. | 257/471 |
| 2005/0253217 A1* | 11/2005 | Pan et al. | 257/492 |
| 2008/0029844 A1* | 2/2008 | Adkisson et al. | 257/530 |
| 2008/0124905 A1* | 5/2008 | Brase et al. | 438/558 |
| 2008/0258153 A1* | 10/2008 | Yamamoto et al. | 257/77 |
| 2009/0309169 A1* | 12/2009 | Wu | 257/390 |
| 2010/0237472 A1* | 9/2010 | Gillis et al. | 257/621 |
| 2010/0289110 A1* | 11/2010 | Tarui et al. | 257/490 |
| 2011/0291279 A1* | 12/2011 | McGahay et al. | 257/758 |
| 2012/0242400 A1* | 9/2012 | Shaeffer et al. | 327/536 |
| 2013/0062723 A1* | 3/2013 | Henning et al. | 257/484 |

* cited by examiner

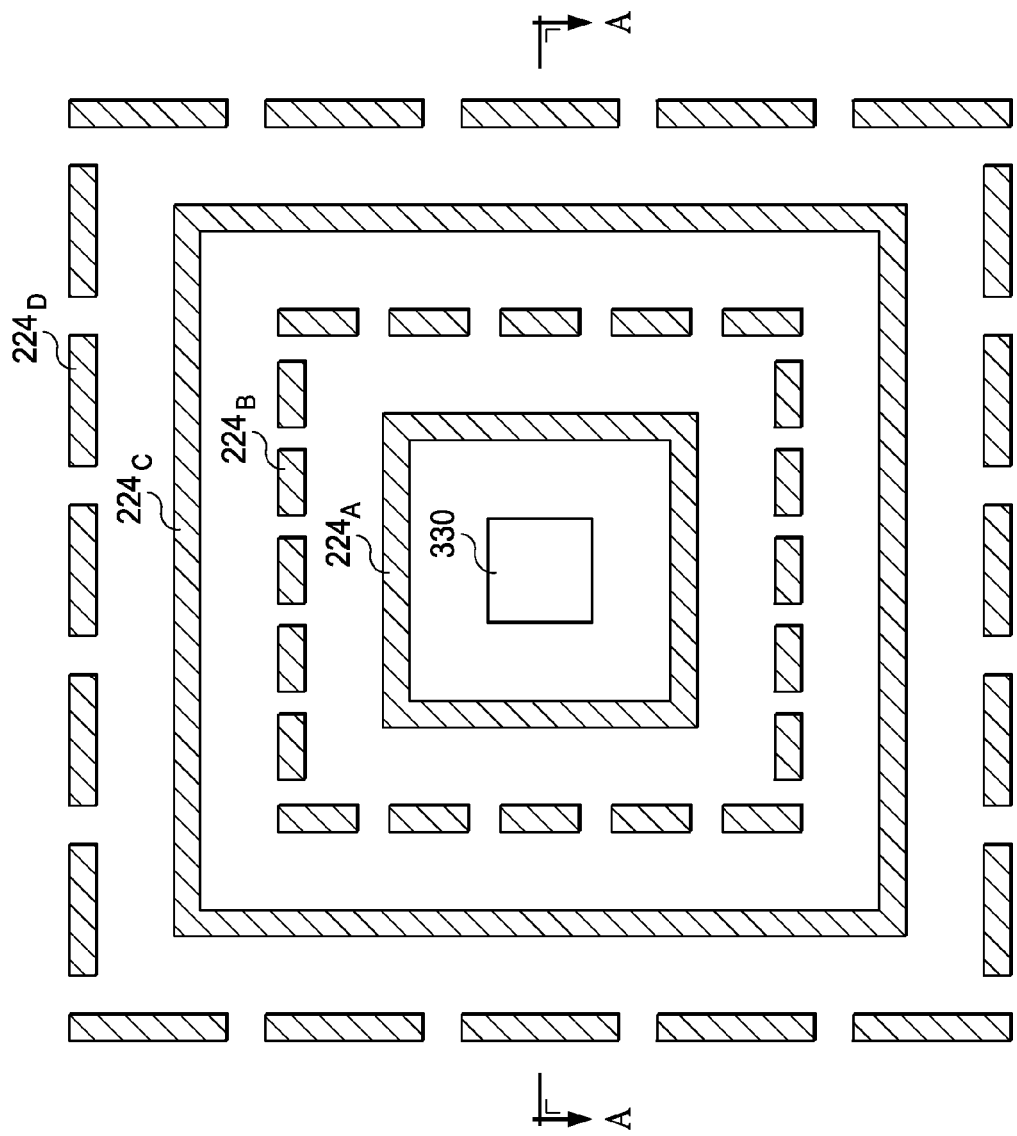

GUARD RING FOR THROUGH VIAS

BACKGROUND

Since the invention of the integrated circuit (IC), the semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvements in lithography have resulted in considerable improvement in 2D IC formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate.

More recent attempts have focused on through vias, e.g., through-substrate vias (TSVs). Generally, a through via is formed by etching a vertical via through a substrate and filling the via with a conductive material, such as copper.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 7A and 7B are a plan view and a cross-sectional view, respectively, of a composite guard ring in accordance with another embodiment.

DETAILED DESCRIPTION OF ILLUSTRATIVE EMBODIMENTS

The making and using of the embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure. Throughout the various views and illustrative embodiments, like reference numbers are used to designate like elements.

In the following description, embodiments are disclosed in the context of forming through vias through a semiconductor substrate for illustrative purposes. In other embodiments, other substrates may be used, such as through vias extending through interposers, organic substrates, inorganic substrates, packaging substrates, or the like.

Figure 1:
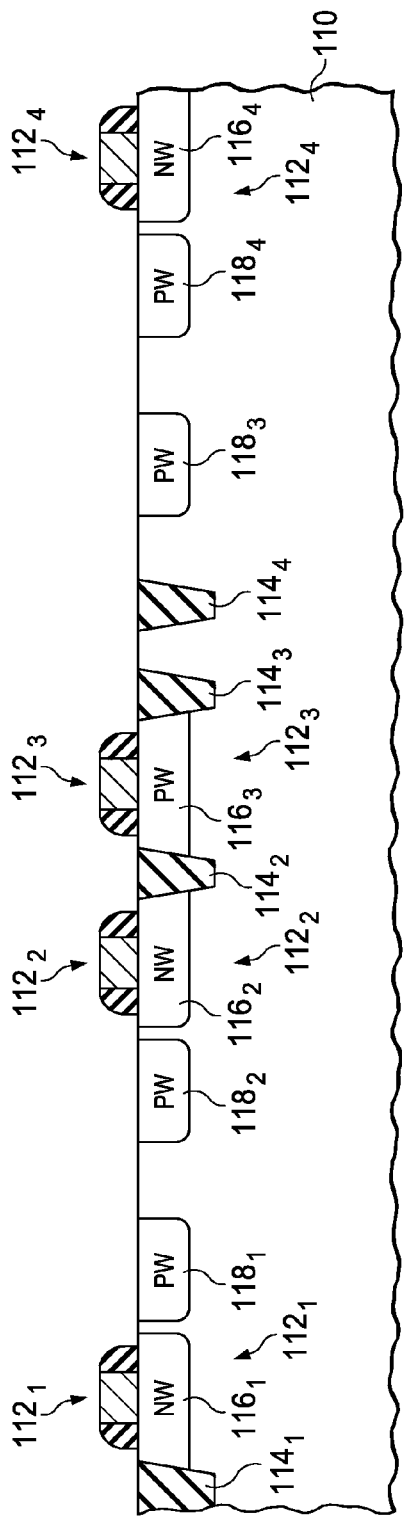
FIGS. 1-4 illustrate various intermediate stages of a through via with a guard ring in accordance with an embodiment.

Referring first to FIG. 1, a substrate 110 having electrical circuitry $112_1$-$112_4$ (collectively referred to as electrical circuitry 112) formed thereon is shown. The substrate 110 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

Shallow trench isolations (STIs) $114_1$-$114_4$ (collectively referred to as STIs 114), or other isolation structures, may be formed in substrate 110 to isolate device regions. STIs 114 may be formed by etching substrate 110 using photolithography techniques to form recesses. Generally, photolithography involves depositing a photoresist material, which is then masked, exposed, and developed. After the photoresist mask is patterned, an etching process may be performed to remove unwanted portions of the substrate 110 as illustrated in FIG. 1. In an embodiment in which the substrate comprises bulk silicon, the etching process may be a wet or dry, anisotropic or isotropic, etch process. The recesses are then filled with a dielectric material such as an oxide layer formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. A planarization step may be performed to planarize the surface of the isolation material with a top surface of the substrate 110. The planarization step may be accomplished, for example, using a chemical mechanical polishing (CMP) process known and used in the art. In an embodiment the STIs have a depth from about 2,000 Å to about 4,000 Å. Other embodiments may utilize different dimensions.

The electrical circuitry 112 may be formed in a device region and may include various N-type metal-oxide semiconductor (NMOS) and/or P-type metal-oxide semiconductor (PMOS) devices. FIG. 1 illustrates the electrical circuitry $112_3$ as an NMOS transistor formed in a p-well $116_3$ and PMOS transistors $112_1$, $112_2$, and $112_4$ formed in n-wells $116_{11}$, $116_2$, and $116_4$, respectively, for illustrative purposes only. Accordingly, the electrical circuitry 112 may include any device suitable for a desired application, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only and are not meant to limit the present disclosure in any manner. Other circuitry may be used as appropriate for a given application.

FIG. 1 further illustrates guard wells $118_1$-$118_4$ (collectively referred to as guard wells 118). As will be explained in greater detail below, guard rings extending through one or more overlying dielectric layers will be formed surrounding through vias. The guard wells 118 provide an electrical contact for the through via guard rings to ground via the substrate 110, thereby reducing electrical interference caused by the through vias. In an embodiment in which a p-type substrate is used, the guard wells 118 may be formed by implanting p-type ions, such as boron ions, at a dose of about 1E12 to about 1E14 atoms/cm$^2$ and at an energy of about 20 KeV to about 500 KeV. In an embodiment, the guard wells have a depth of about 10,000 Å to about 30,000 Å and a width of about 3,000 Å to about 10,000 Å. Other embodiments may utilize different depths, widths, and/or doping parameters.

Figure 2:
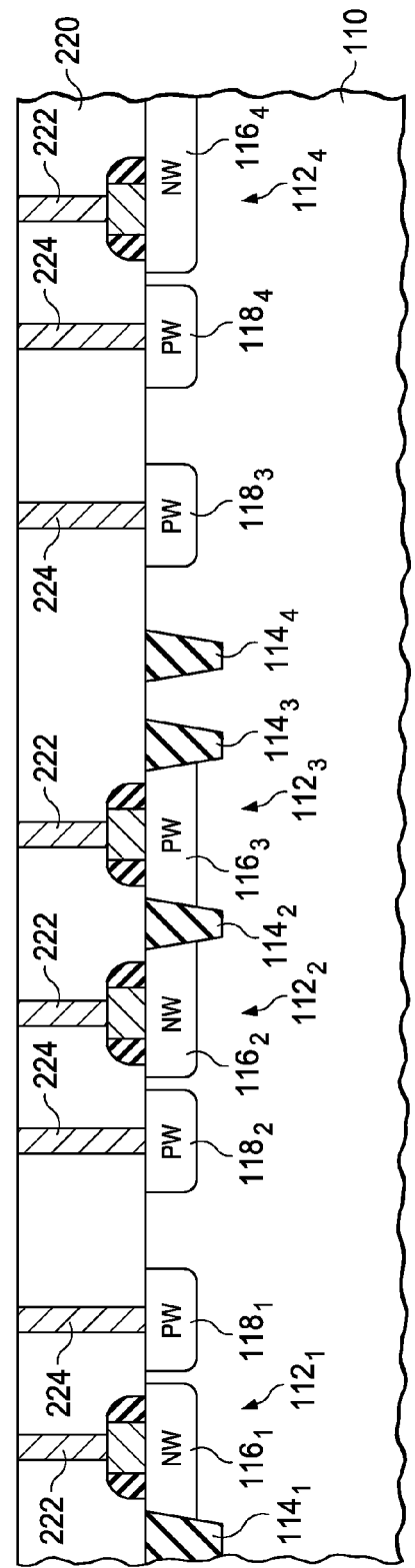

Referring now to FIG. 2, a first insulating layer 220, e.g., an inter-layer dielectric (ILD), is formed over the substrate 110. The first insulating layer 220 may comprise a low dielectric constant (k value less than about 3.0) or an extreme low dielectric constant (k value less than about 2.5). For example, the first insulating layer 220 may comprise an oxide, $SiO_2$, borophosphosilicate glass (BPSG), TEOS, spin-on glass (SOG), undoped silicate glass (USG), fluorinated silicate glass (FSG), high-density plasma (HDP) oxide, or plasma-enhanced TEOS (PETEOS), as examples. A planarization process, such as a CMP process, may be performed to planarize the first insulating layer 220.

FIG. 2 also illustrates formation of contact plugs 222 and guard ring plugs 224 in the first insulating layer 220 in accordance with an embodiment. Openings through the first insulating layer 220 may be formed by, for example, photolithography techniques by depositing and patterning a photoresist layer to expose a portion of the first insulating layer 220 corresponding to the desired position of the openings. Thereafter, the first insulating layer 220 may be etched using an anisotropic etching process.

The contact plugs 222 and guard ring plugs 224 may be formed with a conductive material such as W, or other metals, as examples. Optionally, a barrier layer, such as TiN, TaN, W, or the like, may be formed over the first insulating layer 220 and along sidewalls of the first insulating layer 220 prior to depositing the contact/guard ring plug material. Excessive amounts of the conductive material may be removed from the top surface of the first insulating layer 220 using a planarization process, such as a CMP process. In an embodiment, the guard ring plugs 224 have a width of about 300 Å to about 600 Å. Other embodiments may utilize different dimensions, e.g., different widths.

Figure 3:
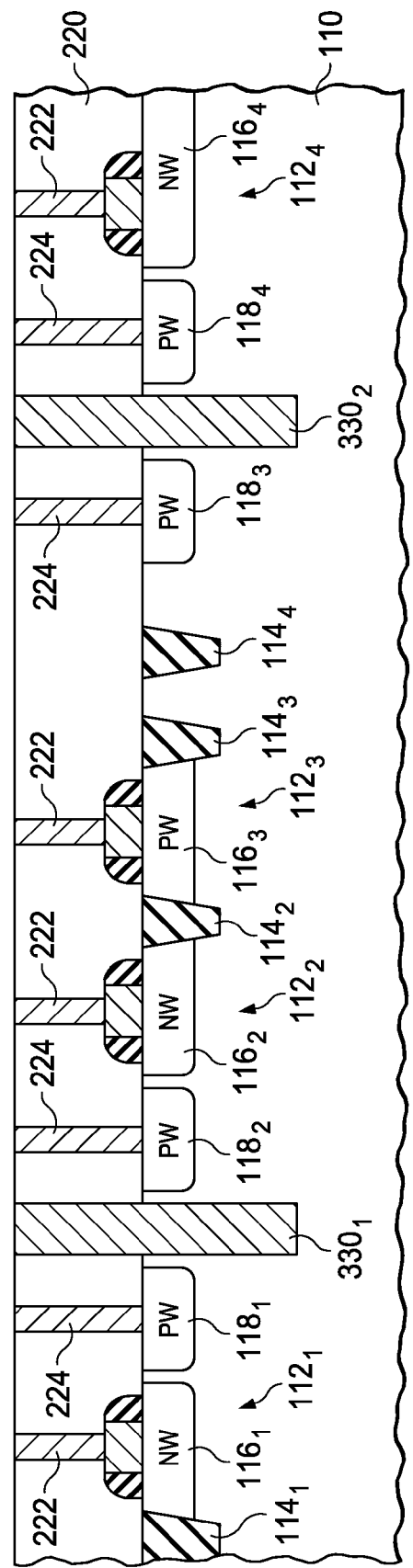

FIG. 3 illustrates formation of through vias $330_1$ and $330_2$, collectively referred to as through vias 330, in accordance with an embodiment. The through vias 330 may be formed by, for example, etching, milling, laser techniques, a combination thereof, and/or the like recesses from a top surface of the first insulating layer 220 into the substrate 110. A thin barrier layer (not shown) may be deposited over the sidewalls of the recesses, such as by chemical vapor deposition (CVD), atomic layer deposition (ALD), physical vapor deposition (PVD), thermal oxidation, a combination thereof, and/or the like. The barrier layer may comprise a nitride or an oxynitride, such as titanium nitride, titanium oxynitride, tantalum nitride, tantalum oxynitride, tungsten nitride, a combination thereof, and/or the like. A conductive material may be deposited over the thin barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer may be removed by, for example, CMP, thereby forming the through vias 330 as illustrated in FIG. 3.

Figure 4:
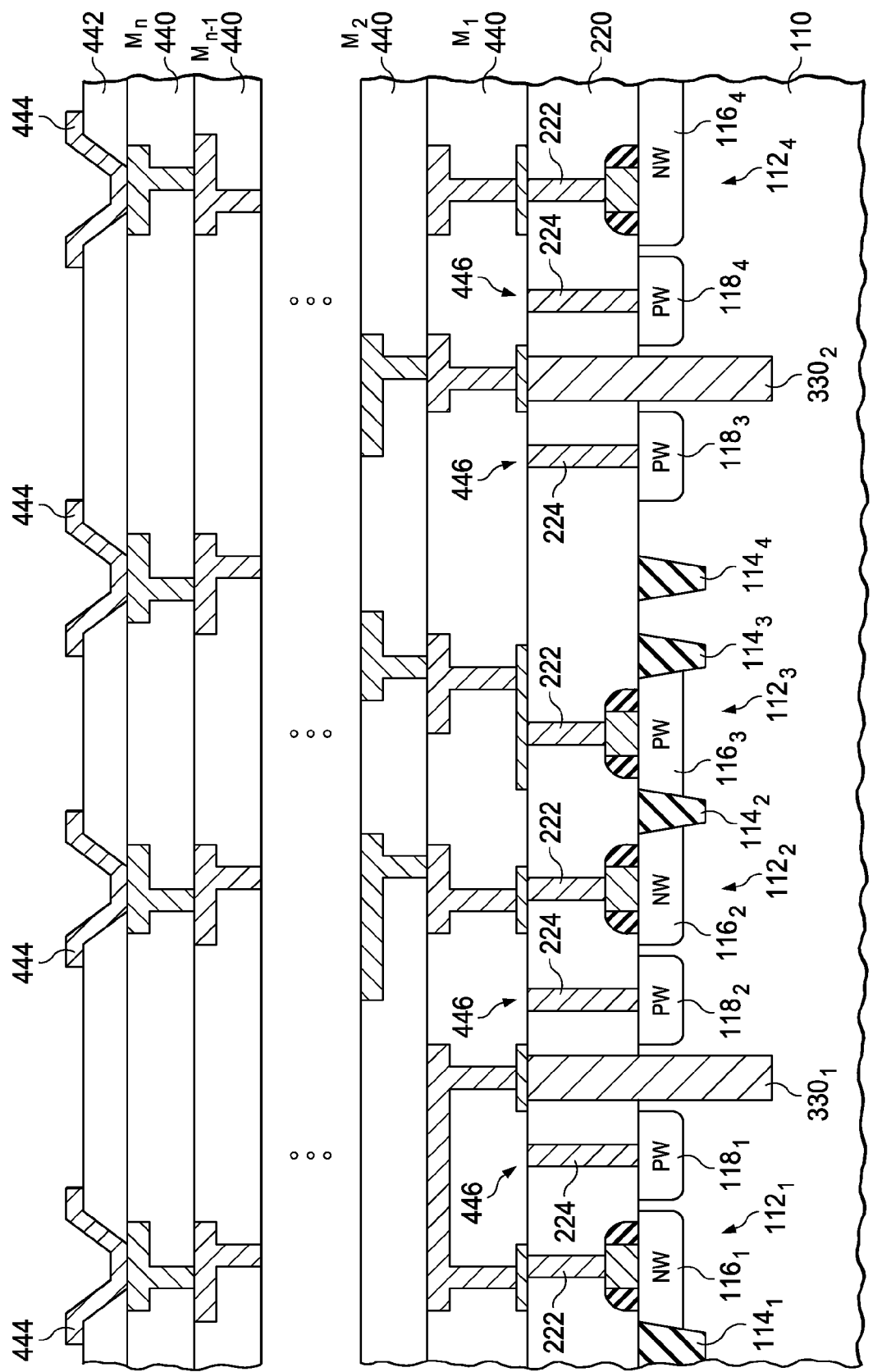

Thereafter, one or more metallization layers $M_1$-$M_n$ may be formed over the first insulating layer 220 as illustrated in FIG. 4. Generally, the metallization layers $M_1$-$M_n$ comprise layers of conductive wiring comprising conductive lines and vias to electrically couple individual ones of electrical devices, e.g., the electrical circuitry 112, together and/or to provide an external electrical connection. The layers of conductive wiring are formed in layers of a dielectric material, such as inter-metal dielectric (IMD) layers 440. The IMD layers 440 may comprise a low dielectric constant or an extreme low dielectric constant (ELK) material, such as an oxide, $SiO_2$, borophosphosilicate glass (BPSG), TEOS, spin on glass (SOG), undoped silicate glass (USG), fluorinated silicate glass (FSG), high-density plasma (HDP) oxide, or plasma-enhanced TEOS (PETEOS). A planarization process, such as a chemical-mechanical polish (CMP) process, may be performed to planarize the various IMD layers 440.

The metallization layers $M_1$-$M_n$ may be formed, e.g., using a plating and etching process or through a damascene or dual-damascene process, in which openings are etched into the corresponding dielectric layer and the openings are filled with a conductive material. Using a damascene process for the first metallization layer $M_1$ may include a deposit of an additional dielectric layer (not shown).

Metallization layers $M_1$-$M_n$ may be formed of any suitable conductive material, such as a highly-conductive metal, low-resistive metal, elemental metal, transition metal, or the like. In an embodiment the metallization layers $M_1$-$M_n$ may be formed of copper, although other materials, such as tungsten, aluminum, gold, or the like, could alternatively be utilized. In an embodiment in which the metallization layers $M_1$-$M_n$ is formed of copper, the metallization layers $M_1$-$M_n$ may be deposited by electroplating techniques, although any method of formation could alternatively be used.

The metallization layers $M_1$-$M_n$ may include a liner and/or a barrier layer. For example, a liner (not shown) may be formed over the dielectric layer in the openings, the liner covering the sidewalls and bottom of the opening. The liner may be either tetraethylorthosilicate (TEOS) or silicon nitride, although any suitable dielectric may alternatively be used. The liner may be formed using a plasma enhanced chemical vapor deposition (PECVD) process, although other suitable processes, such as physical vapor deposition or a thermal process, may alternatively be used. The barrier layer (not shown) may be formed over the liner (if present) and covering the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), combinations of these, or the like. The barrier layer may comprise tantalum nitride, although other materials, such as tantalum, titanium, titanium nitride, combinations of these, and the like may alternatively be used.

It should be noted that FIG. 4 illustrates that the through vias 330 may be either electrically connected to one of the electrical devices, e.g., such as through via $330_1$, or may be electrically coupled to an external electrical connection on the device side of the substrate 110, such as through via $330_2$. In this later example, the through via $330_2$ acts as a pass-through via, allowing devices coupled to the device side of the substrate to electrically communicate to devices coupled to the backside of the substrate.

FIG. 4 also illustrates a passivation layer 442 having external contacts 444 formed therein in accordance with an embodiment. The passivation layer 442, such as a polyimide material, USG, or the like, may be formed and patterned over the surface of the upper metallization layer, e.g., metallization layer $M_n$. The external contacts 444 such as Cu, W, CuSn, AuSn, InAu, PbSn, or the like, are formed to provide electrical contact to respective ones of the electrical circuits 112 and/or through vias 330. The external contacts 444 may include an under-bump metallization (UBM) structure.

As discussed above, in the embodiment illustrated in FIG. 4 guard rings 446 comprising the guard ring plugs 224 and the guard wells 118 are formed around at least a portion of the through vias 330. In this manner, the guard rings 446 provide a structural barrier and/or electrical barrier to protect the devices and materials near the through vias. For example, it is believed that the processes used to form the through vias may cause performance drift issues, such as an increase in the resistance of gate threshold voltage. It has also been found that the processes used to form the through vias may cause cracks in the ILD layer and/or the substrate, potentially causing device failures. Further, it is believed that the current carrying through vias 330 may cause electrical interference with nearby devices, and that the grounded guard rings 446 may prevent or reduce the electrical interference.

Thereafter, other back-end-of-line (BEOL) processing techniques suitable for the particular application may be performed to complete the semiconductor device. For example, a backside of the substrate 110 may be thinned to expose the through vias and contacts and/or redistribution lines may be formed to provide an electrical contact to the through vias. Passivation layers, external contacts, connectors (e.g., solder bumps) may be formed on one or both sides of the substrate, an encapsulant may be formed, a singulation process may be performed to singulate individual dies, wafer-level or die-level stacking, and the like, may be performed. It should be noted, however, that embodiments disclosed herein may be used in many different situations. For example, embodiments of the present disclosure may be used in a die-to-die bonding configuration, a die-to-wafer bonding configuration, a wafer-to-wafer bonding configuration, die-to-substrate bonding configuration, wafer-do-substrate bonding configuration, or the like.

Figure 5A:
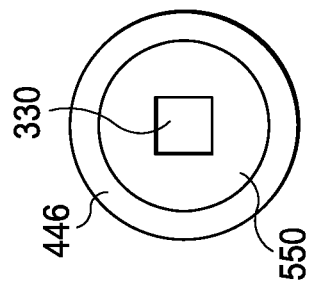
FIGS. 5A-5D illustrate various shapes of a guard ring.
Figure 5C:
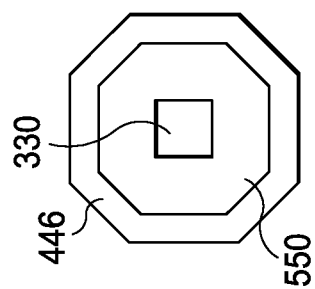
Figure 5B:
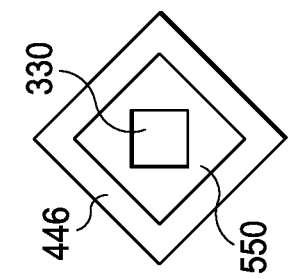
Figure 5D:
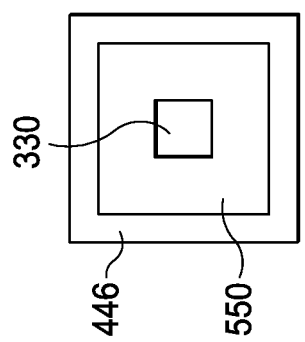

FIGS. 5A-5D illustrate various plan views of the guard rings 446 around the through vias 330. The shape formed by the guard rings 446 may be, for example, an octagon as illustrated in FIG. 5A, a circle as illustrated in FIG. 5B, a square as illustrated in FIG. 5C, a rhombus as illustrated in FIG. 5D, or any other suitable shape. As illustrated in FIGS. 5A-5D, the guard rings 446 form an inner region 550, through which the TVs 330 are formed.

Figure 6:
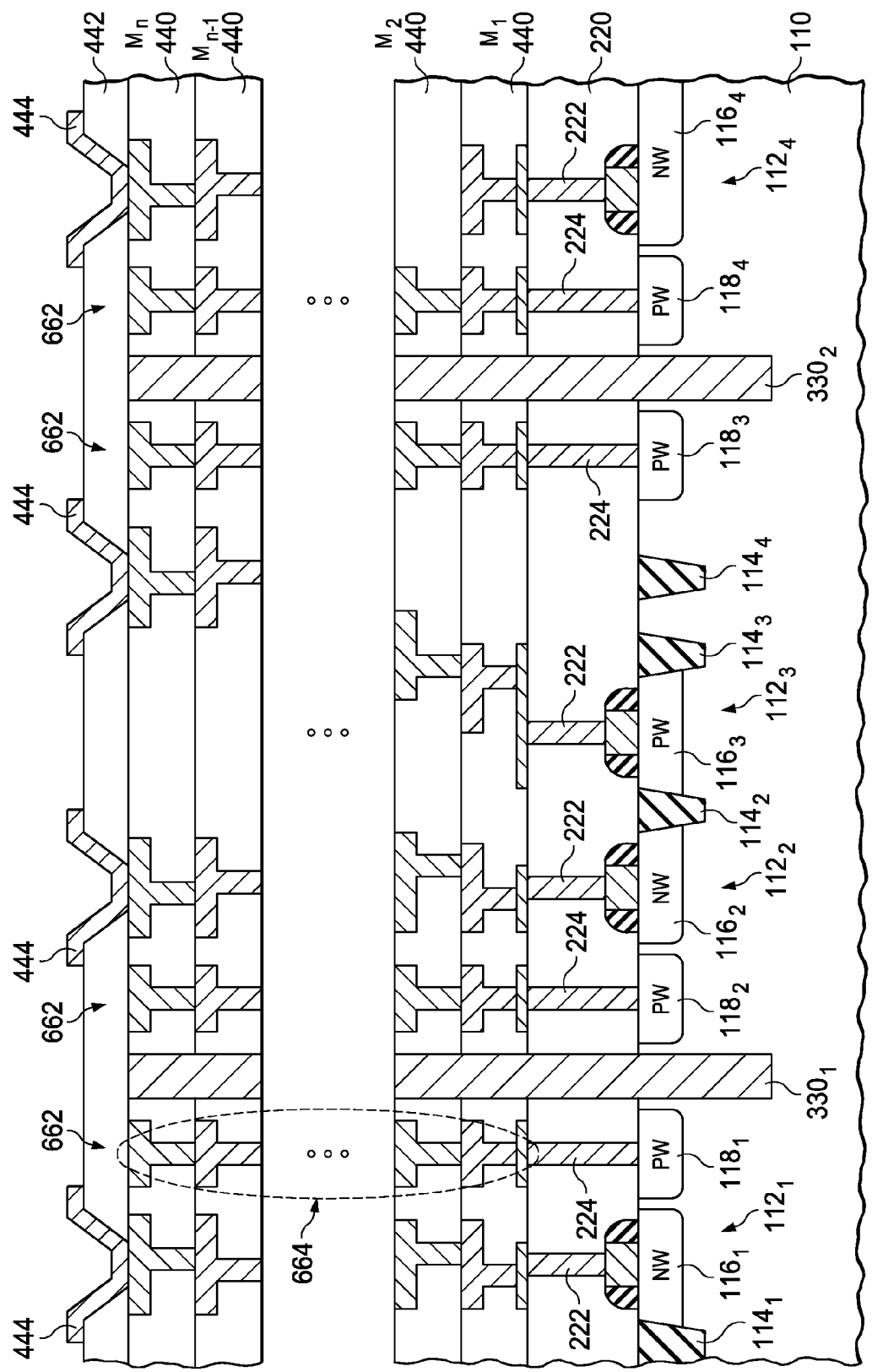
FIG. 6 illustrates an intermediate stage of a through via with a guard ring in accordance with another embodiment.

FIG. 6 illustrates another embodiment. While FIGS. 1-4 disclose a device and method using a via-first configuration (e.g., i-TSV) wherein the through vias 330 are formed prior to forming the metallization layers $M_1$-$M_n$, the embodiments discussed below with reference to FIG. 6 illustrates a device and method using a via-last configuration (e.g., p-TSV) wherein the through via is formed after one or more of the metallization layers.

The process illustrated in FIG. 6 assumes steps similar to those discussed above with reference to FIGS. 1-2 have been performed. As such, FIG. 6 illustrates the substrate 110 of FIG. 2 after forming one or more metallization layers $M_1$-$M_n$ over the ILD layer. The metallization layers $M_1$-$M_n$ may be formed using similar processes and materials as those discussed above with reference to FIG. 4.

As illustrated in FIG. 6, the through vias 330 are formed through one or more of the metallization layers $M_1$-$M_n$. In an embodiment, guard rings 662 may include the guard wells 118, the guard ring plugs 224, and guard ring interconnect structures 664. The guard ring interconnect structures 664 may comprise lines and vias formed in one or more of the metallization layers $M_1$-$M_n$ and may be formed in a similar manner and with similar materials as used for the metallization layers $M_1$-$M_n$. It should be noted that the guard ring interconnect structures 664 may not extend completely to the surface. For example, the embodiment illustrated in FIG. 6 shows the guard ring interconnect structures 664 extending to the surface of the uppermost metallization layer $M_n$, but not necessarily extending through the passivation layer 442.

It is believed that because of the structural characteristics of the ELK dielectrics layers, extending the guard ring 662 through layers formed ELK dielectrics is beneficial in preventing or reducing the stresses in the ELK dielectric layers. For example, in an embodiment in which an ELK material is used to form the metallization layers $M_1$-$M_n$, and USG is used as a passivation layer 442, it is believed that extending the guard ring 662 from the USG passivation layer 442 through the ELK metallization layers $M_1$-$M_n$ as illustrated in FIG. 6 provides additional support, prevents or reduces device performance shift, prevents or reduces cracking, and the like.

Figure 7B:
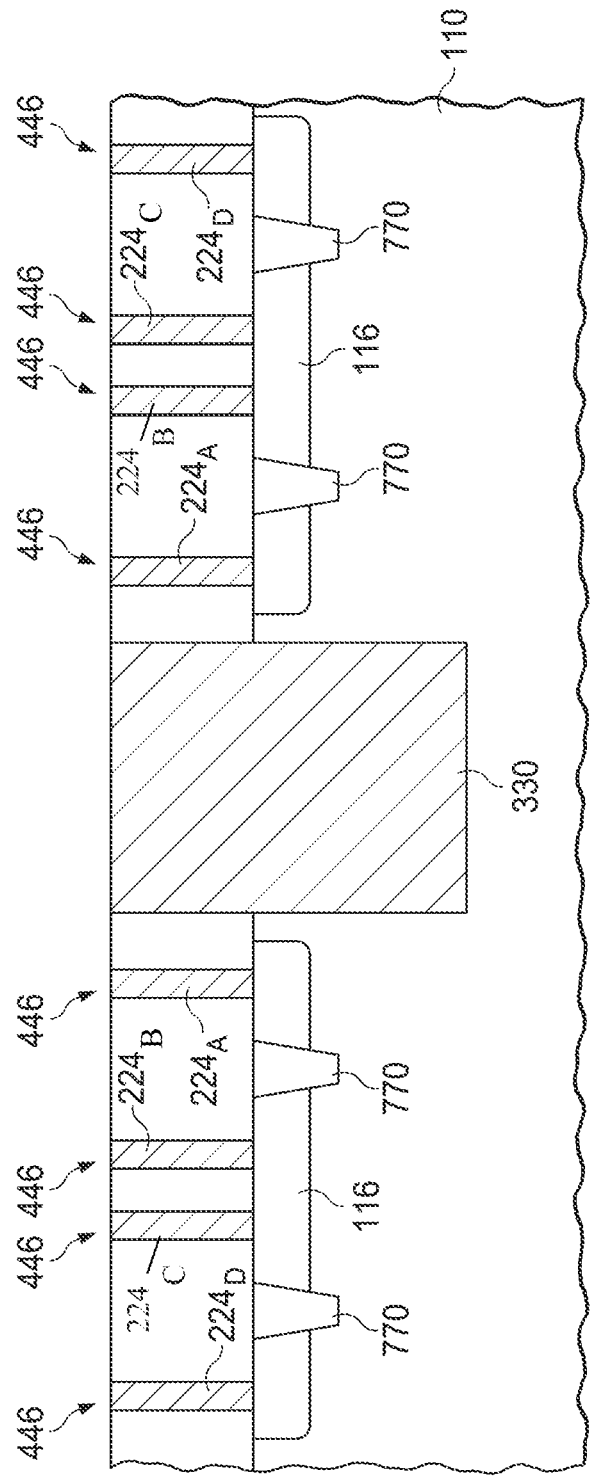

FIGS. 7A and 7B illustrate an embodiment that provides multiple guard rings 446 (see, e.g., FIG. 4), comprising multiple guard ring plugs $224_A$-$224_D$. FIG. 7A is a plan view and FIG. 7B is a corresponding cross-sectional view taken along the A-A line of FIG. 7A. It is noted that FIGS. 7A and 7B show an enlarged portion of the corresponding section of FIGS. 1-4 to better illustrate the differences between these embodiments. Processes similar to those discussed above with reference to FIGS. 1-4 may be used by modifying the masks appropriately to form the multiple guard ring plugs $224_A$-$224_D$.

It should be noted that one or more of the guard ring plugs $224_A$-$224_D$ may comprise a broken shape, e.g., a dotted line in the plan view, around the through via 330. For example, as illustrated in FIG. 7A, guard ring plugs $224_A$ and $224_C$ form solid shape around through via 330, while guard ring plugs $224_B$ and $224_D$ form a broken shape, e.g., a dotted-line shape, around the through via 330. Other configurations of the solid and broken shapes may be used. In an embodiment, at least one of the guard ring plugs 224 around the through via 330 form a solid shape. It should be noted that four guard rings plugs $224_A$-$224_D$, two of which form solid shapes and two of which form broken shapes in an alternating manner, are shown for illustrative purposes only. Other embodiments may use more or fewer guard ring plugs 224, more or fewer solid shapes, and more or fewer broken shapes.

As illustrated in FIG. 7B, the guard rings 446 may share a common guard well 116. For example, FIG. 7B illustrates three separate guard wells: one for the leftmost guard ring, one for the middle two guard rings, and one for the innermost guard ring. Other embodiments may utilize other combinations of shared and/or individual guard wells.

FIG. 7B also illustrates one or more STIs 770 formed within the guard wells 116. It is believed that in embodiments utilizing multiple guard ring plugs 224 such as that illustrated in FIG. 7B, guard rings 446 comprising the STIs 770 may further act to prevent or reduce the stress and performance drift. It should be noted that one or more STIs 770 may also be used in embodiments utilizing a single guard ring plug (e.g., such as that discussed above with reference to FIGS. 1-4), provided sufficient area exists in the device design. Generally, in embodiments in which sufficient space exists for multiple guard ring plugs, sufficient space is likely to exist for one or more STIs, which may further prevent or reduce the stress and performance drift. It should be noted that two STIs 770 are illustrated in FIG. 7B for illustrative purposes only and that other embodiments may have more or fewer STIs.

Figure 8:
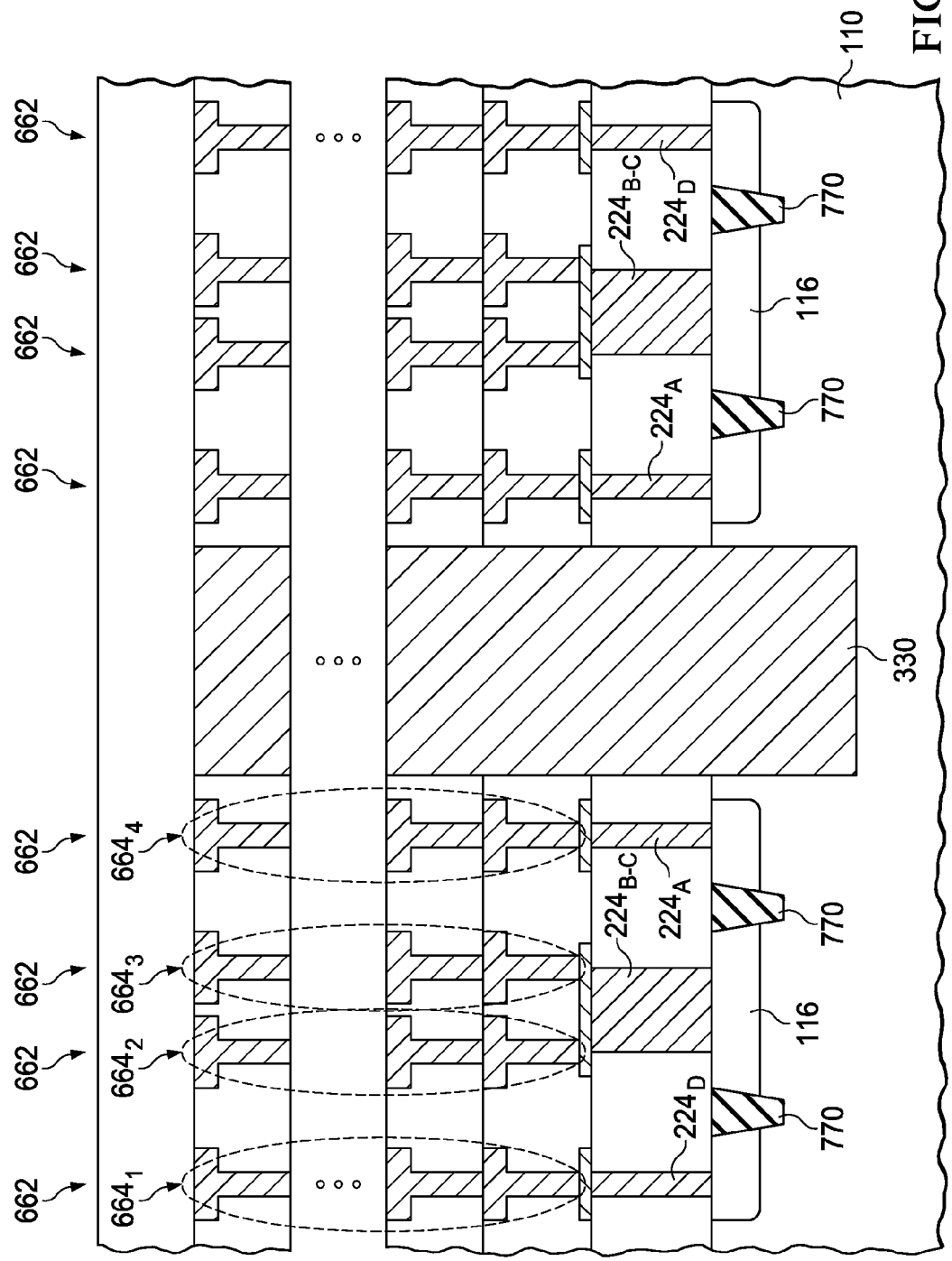
FIG. 8 is a cross-sectional view of a composite guard ring in accordance with another embodiment.

FIG. 8 illustrates an embodiment similar to that discussed above with reference to FIG. 6, but in which utilizes multiple guard rings 662, comprising multiple guard ring plugs $224_A$-$224_B$ coupled to respective ones of multiple guard ring interconnect structures 664. This embodiment is also similar to the embodiment illustrated in FIGS. 7A and 7B, except that in addition to multiple guard ring plugs 224, multiple guard ring interconnect structures 664 extending through one or more of the IMD layers 440 are utilized as well.

It is noted that FIG. 8 shows an enlarged portion of the corresponding section of FIG. 6 to better illustrate the differences between these embodiments. Processes similar to those discussed above with reference to FIG. 6 may be used by modifying the masks appropriately to form the multiple guard ring plugs $224_A$-$224_D$ and multiple guard ring interconnect structures 664.

It should be noted that one or more of the multiple guard ring interconnect structures 664 may electrically couple to a single guard ring plug such that there is not a one-to-one relationship between the guard ring interconnect structures and the guard ring plugs. For example, FIG. 8 illustrates that the guard ring interconnect structures $664_2$ and $664_3$ are electrically coupled to the single guard ring plug $224_{B-C}$.

In an embodiment, a method comprising providing a substrate; forming one or more dielectric layers over the substrate; forming a first guard ring extending through one or more of the one or more dielectric layers; and forming a through via in an inner region of the guard ring is provided.

In another embodiment, a method comprising providing a substrate; forming a guard well in the substrate; forming an inter-layer dielectric (ILD) layer over the substrate; forming a guard ring in the ILD layer, the guard ring enclosing an inner region separated from electrical circuitry formed on the substrate; and forming a through via in the inner region, the through via extending through the ILD layer to the substrate is provided.

In yet another embodiment, an electrical device comprising a substrate; one or more dielectric layers formed over the substrate; a guard ring in at least one of the one or more dielectric layers, the guard ring having an interior region and an exterior region; and a through via extending through at least one of the one or more dielectric layers, the through via extending through the interior region of the guard ring is provided.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
providing a substrate;
forming a plurality of dielectric layers over the substrate;
forming a guard well in the substrate;
forming a first guard ring extending through one or more of the plurality of dielectric layers and contacting the guard well; and
forming a through via in an inner region of the first guard ring, the first guard ring and the guard well being interposed between the through via and all other electrical circuitry along a surface of the substrate.

2. The method of claim 1, wherein the forming the plurality of dielectric layers includes forming one or more metallization layers, and wherein the forming the first guard ring comprises forming metal lines and vias extending through one or more of the metallization layers, the metal lines extending around the through via.

3. The method of claim 1, wherein the through via begins at an upper surface of an inter-layer dielectric and extends into the substrate.

4. The method of claim 1, further comprising a second guard ring extending through one or more of the plurality of dielectric layers.

5. The method of claim 4, wherein at least one of the first guard ring and the second guard ring forms a discontinuous shape around the through via.

6. The method of claim 4, wherein at least one of the first guard ring and the second guard ring forms a solid shape around the through via.

7. The method of claim 1, wherein the forming a plurality of dielectric layers comprises forming at least one extreme low-k (ELK) dielectric layer and wherein the first guard ring extends through the at least one extreme low-k (ELK) dielectric layer.

8. The method of claim 1, wherein the forming the guard well comprises forming a p-well in the substrate.

9. The method of claim 1, wherein the guard well has a depth of about 10,000 Å to about 30,000 Å.

10. An electrical device comprising:
a substrate;
one or more dielectric layers formed over the substrate;
a guard ring in at least one of the one or more dielectric layers, the guard ring having an interior region and an exterior region, wherein the guard ring comprises a contact extending through an inter-layer dielectric (ILD) layer to the substrate, and wherein the guard ring further comprises a doped well in the substrate below the contact of the guard ring, the contact being in electrical contact with doped well;
electrical circuitry in the exterior region of the guard ring; and
a through via extending through at least one of the one or more dielectric layers within the interior region of the guard ring, the guard ring being electrically isolated from the through via.

11. A method comprising:
providing a substrate;
forming a guard well in the substrate;
forming an inter-layer dielectric (ILD) layer over the substrate;
forming a guard ring over the guard well in the ILD layer, the guard ring and the guard well enclosing an inner region separated from electrical circuitry formed on the substrate; and
forming a through via in the inner region, the through via extending through the ILD layer to the substrate, no electrical circuitry other than the through via being formed on the substrate in the inner region.

12. The method of claim 11, further comprising forming one or more inter-metal dielectric (IMD) layers over the ILD layer, the through via extending through one or more of the one or more IMD layers.

13. The method of claim 11, further comprising forming one or more inter-metal dielectric (IMD) layers over the ILD layer, and wherein the guard ring extends through one or more of the IMD layers.

14. The method of claim 13, wherein the forming the guard ring comprises forming interconnects through the IMD layers such that the interconnects contact an underlying conductive layer.

15. The method of claim 11, wherein the forming the guard ring comprises forming one or more additional guard rings.

16. The method of claim 15, wherein at least one of the additional guard rings forms a solid shape around the through via.

17. The electrical device of claim 10, wherein the doped well has a depth of about 10,000 Å to about 30,000 Å.

18. The electrical device of claim 10, wherein the through via extends through one or more inter-metal dielectric layers.

19. The electrical device of claim 10, further comprising one or more additional guard rings.

20. The electrical device of claim 19, wherein at least one of the guard rings and the additional guard rings comprise at least one continuous ring around the through via.

* * * * *